(12) United States Patent
Ling et al.

(10) Patent No.: US 10,580,839 B2
(45) Date of Patent: *Mar. 3, 2020

(54) SELF-LUMINOUS DISPLAY PIXEL (71) Applicant: Shanghai Oxi Technology Co., Ltd, Shanghai (CN)

(72) Inventors: Yan Ling, Shanghai (CN); Hong Zhu, Shanghai (CN)

(73) Assignee: SHANGHAI OXI TECHNOLOGY CO., LTD., Shanghai (CN)

( * ) Notice: Subject to any disclaimer, the term of this patent is extended or adjusted under 35 U.S.C. 154(b) by 59 days.

This patent is subject to a terminal disclaimer.

(21) Appl. No.: 15/753,007

(22) PCT Filed: Feb. 15, 2017

(86) PCT No.: PCT/CN2017/073607
§ 371 (c)(1),
(2) Date: Feb. 15, 2018

(87) PCT Pub. No.: WO2018/040512
PCT Pub. Date: Mar. 8, 2018

(65) Prior Publication Data
US 2019/0006441 A1    Jan. 3, 2019

(30) Foreign Application Priority Data
Aug. 31, 2016   (CN) .......................... 2016 1 0786852

(51) Int. Cl.
*H01L 27/32*     (2006.01)
*H01L 31/105*    (2006.01)
(Continued)

(52) U.S. Cl.
CPC ........ *H01L 27/3234* (2013.01); *G06K 9/0004* (2013.01); *H01L 27/14612* (2013.01);
(Continued)

(58) Field of Classification Search
CPC .... H01L 27/32; H01L 27/323; H01L 27/3234
(Continued)

(56) References Cited

U.S. PATENT DOCUMENTS

| 6,815,654 B1 * | 11/2004 | Fujieda | ............ H01L 27/14643 |
| | | | 250/208.1 |
| 2012/0187303 A1 * | 7/2012 | Okada | ..................... G01T 1/247 |
| | | | 250/370.08 |

(Continued)

FOREIGN PATENT DOCUMENTS

| CN | 103928477 A | 7/2014 |
| CN | 105243361 A | 1/2016 |

(Continued)

OTHER PUBLICATIONS

International Search Report and Written Opinion from PCT/CN2017/073607, dated Feb. 24, 2017 (in Chinese language).

*Primary Examiner* — Fazli Erdem
(74) *Attorney, Agent, or Firm* — Adsero IP (57) ABSTRACT

A self-luminous display pixel is provided, including: a self-luminous circuit including a self-luminous device, the self-luminous device including a bottom electrode layer; wherein the bottom electrode layer includes a light blocking layer; and the self-luminous display pixel further includes an optical fingerprint sensing circuit, the optical fingerprint sensing circuit includes a first TFT device and a photosensitive device, and a channel layer of the first TFT device is disposed right under a portion of the bottom electrode layer. A fingerprint sensing function can be realized by the self-luminous display pixel, and an overall structure of the self-luminous display pixel can be optimized.

12 Claims, 3 Drawing Sheets

(51) Int. Cl.
*H01L 51/52* (2006.01)
*G06K 9/00* (2006.01)
*H01L 27/146* (2006.01)
*H01L 27/12* (2006.01)

(52) U.S. Cl.
CPC .. *H01L 27/14623* (2013.01); *H01L 27/14678* (2013.01); *H01L 27/3258* (2013.01); *H01L 27/3262* (2013.01); *H01L 27/3265* (2013.01); *H01L 27/3272* (2013.01); *H01L 31/105* (2013.01); *H01L 31/1055* (2013.01); *H01L 51/5206* (2013.01); *H01L 51/5253* (2013.01); H01L 27/124 (2013.01); H01L 27/1248 (2013.01); H01L 27/1255 (2013.01); H01L 27/3276 (2013.01)

(58) Field of Classification Search
USPC .......................................................... 257/72
See application file for complete search history.

(56) References Cited

U.S. PATENT DOCUMENTS

| | | | | |
|---|---|---|---|---|
| 2017/0032167 A1* | 2/2017 | Chen | .................... | H01L 27/3227 |
| 2017/0078513 A1* | 3/2017 | Chang | .................... | G06F 3/0488 |
| 2017/0337418 A1* | 11/2017 | Wang | ................ | G06K 9/00013 |
| 2018/0254288 A1* | 9/2018 | Ling | .................... | G09G 3/3233 |
| 2018/0373915 A1* | 12/2018 | Ling | ...................... | H01L 27/32 |
| 2019/0034686 A1* | 1/2019 | Ling | .................... | G06K 9/0004 |
| 2019/0079628 A1* | 3/2019 | Liu | ........................ | G06F 3/0414 |

FOREIGN PATENT DOCUMENTS

| | | | |
|---|---|---|---|
| CN | 105552159 A | | 5/2016 |
| CN | 106298856 A | | 1/2017 |
| KR | 20120095543 | * | 8/2012 |

* cited by examiner

SELF-LUMINOUS DISPLAY PIXEL

CROSS-REFERENCE TO RELATED APPLICATIONS

The present applications is the national phase of International Application No. PCT/CN2017/073607, filed on Feb. 15, 2017, which claims the benefit of priority to Chinese Patent Application No. 201610786852.7, filed on Aug. 31, 2016, and entitled "SELF-LUMINIOUS DISPLAY PIXEL", the entire disclosures of which are incorporated herein by reference.

TECHNICAL FIELD

The present disclosure generally relates to photo-electronic display field, and more particularly, to a self-luminous display pixel.

BACKGROUND

Display panels are normally applied to display output information of electronic products. The display panel generally includes an array substrate which includes a plurality of display pixels. A self-luminous display pixel is advantageous among kinds of display pixels due to no need of backlight source. A display panel with the self-luminous display pixel also becomes an important development trend of existing display panels due to its advantages like light in weight and power-saving and so on.

However, structures and functions of the existing self-luminous display pixels still remain to be improved.

In order to improve the structures and functions of the existing self-luminous display pixels, new designs and optimization of the self-luminous display pixels are required.

SUMMARY

A self-luminous display pixel is provided according to embodiments of the present disclosure to optimize structures and functions of the existing self-luminous display pixels.

In some embodiment, the self-luminous display pixel may include a self-luminous circuit including a self-luminous device, the self-luminous device including a bottom electrode layer; wherein the bottom electrode layer is a light blocking layer; and the self-luminous display pixel further includes an optical fingerprint sensing circuit, the optical fingerprint sensing circuit includes a first Thin Film Transistor (TFT) device and a photosensitive device, and a channel layer of the first TFT device is disposed right under a portion of the bottom electrode layer.

In some embodiment, the photosensitive device includes a photosensitive semiconductor layer, the photosensitive semiconductor layer includes a PIN diode or a PN diode, and the channel layer of the first TFT device is disposed right under a portion of the photosensitive semiconductor layer; a portion of the photosensitive semiconductor layer is disposed right under the bottom electrode layer, another portion of the photosensitive semiconductor layer is not disposed right under the bottom electrode layer; and the self-luminous display pixel includes a protective layer, the first TFT device and the photosensitive semiconductor layer are covered by the protective layer, and at least a portion of the bottom electrode layer is disposed above an upper surface of the protective layer.

In some embodiment, the photosensitive device further includes a lower electrode layer, the lower electrode layer is a light blocking layer, and a channel layer of the first TFT device is disposed right under a portion of the lower electrode layer.

In some embodiment, the photosensitive device includes a photosensitive semiconductor layer, the photosensitive semiconductor layer includes a PIN diode or a PN diode; the self-luminous device includes a self-luminous semiconductor layer; and the self-luminous display pixel further includes a TFT protective layer, the first TFT device is covered by the TFT protective layer, and both the photosensitive semiconductor layer and the self-luminous semiconductor layer are disposed above an upper surface of the TFT protective layer.

In some embodiment, the photosensitive device further includes a lower electrode layer, and the lower electrode layer is a light blocking layer.

In some embodiment, a gate electrode layer of the first TFT device is disposed under the channel layer; the optical fingerprint sensing circuit further includes an electrode layer disposed at a same layer with the gate electrode layer; the electrode layer is disposed under the photosensitive device, the electrode layer is at least partially parallel to the photosensitive device, and an insulating layer is disposed between the electrode layer and the photosensitive device; and the electrode layer is connected with a common electrode, and the common electrode is connected with a constant potential.

In some embodiment, the photosensitive device includes an upper electrode layer connected with a first common electrode, the first common electrode is connected with a first constant potential; and the self-luminous device includes a top electrode layer connected with a second common electrode, and the second common electrode is connected with a second constant potential.

In some embodiment, a gate electrode layer of the first TFT device is disposed above the channel layer; the optical fingerprint sensing circuit further includes an electrode layer disposed at a same layer with the gate electrode layer; the electrode layer is disposed under the photosensitive device, the electrode layer is at least partially parallel to the photosensitive device, and an insulating layer is disposed between the electrode layer and the photosensitive device; and the electrode layer is connected with a common electrode, and the common electrode is connected with a constant potential.

In some embodiment, the photosensitive device includes an upper electrode layer connected with a first common electrode, the first common electrode is connected with a first constant potential; and the self-luminous device includes a top electrode layer, the top electrode layer is connected with a second common electrode, and the second common electrode is connected with a second constant potential.

In some embodiment, the photosensitive device includes a second TFT device, and a channel layer of the second TFT device is a region where the optical fingerprint sensing circuit receives light reflected by a finger.

In some embodiment, a source electrode of the first TFT device and a drain electrode of the second TFT device are connected by a first electrode layer, or a drain electrode of the first TFT device and a source electrode of the second TFT device are connected by the first electrode layer; the optical fingerprint sensing circuit further includes a second electrode layer disposed under the first electrode layer; and the first electrode layer is at least partially parallel to the second electrode layer, and an insulating layer is disposed between the first electrode layer and the second electrode layer; and the second electrode layer is connected with a common electrode, and the common electrode is connected with a constant potential.

In some embodiment, a light blocking wall is disposed between the self-luminous device and the photosensitive device.

In some embodiment, a light collimating layer is disposed above the photosensitive device.

In some embodiment, light emitted from the self-luminous device is used as a light source for the photosensitive device to capture fingerprint.

Compared with the prior art, the present disclosure has the following advantages.

The self-luminous display circuit and the optical fingerprint sensing circuit are disposed in a same self-luminous display pixel, so that the self-luminous display pixel cannot only support a display function, but also capture fingerprint images based on an optical principle. That is, the self-luminous display pixel can be applied to capture the fingerprint images, and realize a fingerprint identification function, which increases functions of the self-luminous display pixel, and makes the self-luminous display pixel highly integrated. In addition, in the self-luminous display pixel, the channel layer of the first TFT device is disposed right under a portion of the bottom electrode layer, and the bottom electrode layer is a light blocking layer, so that the bottom electrode layer can be used to block light, and to prevent light from reaching the channel layer, thereby avoiding leakage of the captured fingerprint image signals.

Further, by setting the channel layer of the first TFT device to be disposed right under a portion of the photosensitive semiconductor layer, setting a portion of the photosensitive semiconductor layer to be disposed right under a portion of the bottom electrode layer, and setting another portion of the photosensitive semiconductor layer to be not disposed right under the bottom electrode layer, on one hand, the portion of the photosensitive semiconductor layer not right under the bottom electrode can be used to capture fingerprint images; on the other hand, the portion of the photosensitive semiconductor layer right under the bottom electrode layer can increase a total area of the photosensitive semiconductor layer, so that an equivalent capacitance of the photosensitive device can be increased. Therefore, more charge signals can be temporarily stored in the photosensitive device, fingerprint image contrast can be correspondingly increased, and quality of the captured fingerprint images can be also improved.

Further, an electrode layer is disposed on a same layer with a gate electrode layer, and the electrode layer is disposed right under the photosensitive device. A first insulating layer is disposed between the electrode layer and a drain electrode layer of the photosensitive device. The electrode layer is at least partially parallel to the photosensitive device. In this way, the electrode layer and the photosensitive device and a portion disposed therebetween can form a capacitor, which increases an equivalent capacitance of the photosensitive device, so that more charge signals can be temporarily stored in the photosensitive device, fingerprint image contrast can be correspondingly increased, and quality of the captured fingerprint images can also be improved.

Further, an upper electrode layer of the photosensitive device is connected with a first common electrode, and the first common electrode is connected with a first constant potential. A top electrode layer of the self-luminous device is connected with a second common electrode, and the second common electrode is connected with a second constant potential. Since the top electrode layer of the self-luminous device and the upper electrode layer of the photosensitive device are respectively connected with different constant potentials, each of the two devices can be stable and have a smaller electronic noise.

Further, light emitted from the self-luminous circuit may be used as a light source for the optical fingerprint sensing circuit to capture fingerprint images. Therefore, it may be not necessary to configure a dedicated light source for the optical fingerprint sensing circuit, thereby saving cost and simplifying the structure.

Further, a light blocking wall is disposed between the photosensitive device and the self-luminous device. Therefore, it can be avoided that, the light emitted from the self-luminous device directly irradiates the photosensitive device, resulting in that the photosensitive device stays in a signal saturation state and the photosensitive device cannot absorb optical signals of fingerprint.

Further, the photosensitive device includes a lower electrode layer which is a light blocking layer, and the channel layer of the first TFT device is disposed right under a portion of the lower electrode layer, so as to further block entry of light into the channel layer of the first TFT device using the lower electrode layer, and further to avoid signal leakage occurrence in the optical fingerprint sensing circuit.

DETAILED DESCRIPTION

As described in the background art, functions and structures of existing self-luminous display pixels need to be improved and optimized.

A self-luminous display pixel is provided in the present disclosure. By setting an optical fingerprint sensing circuit in the self-luminous display pixel, functions of the self-luminous display pixel can be improved, a structure of the self-luminous display pixel can be optimized, and integration level can be increased.

To make the foregoing objectives, features and advantages of the present disclosure more apparent and comprehensible, specific embodiments of the present disclosure will be described in detail below with reference to the accompanying drawings.

Figure 1:
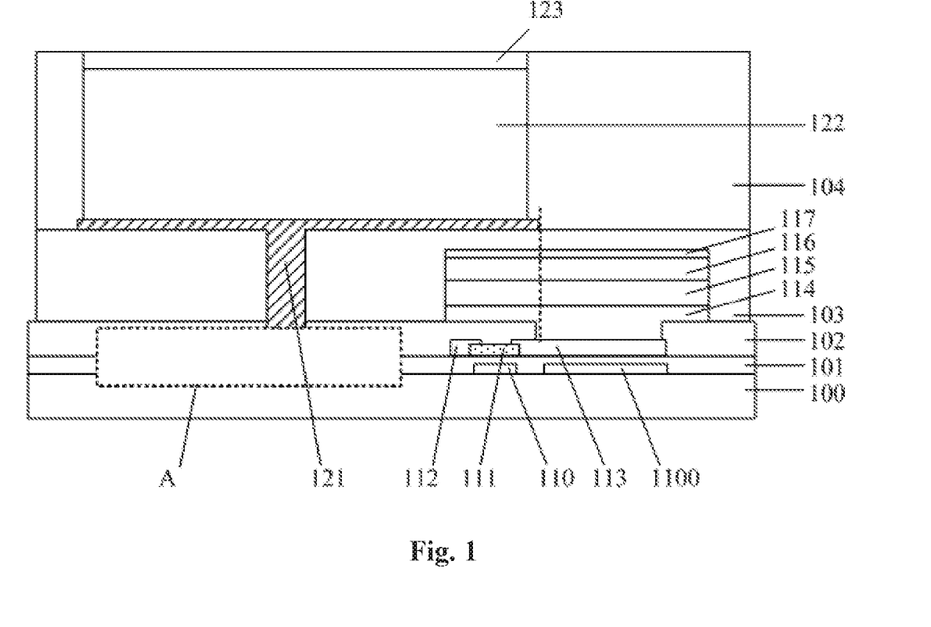
FIG. 1 schematically illustrates a cross-sectional view of a self-luminous display pixel according to an embodiment.

A self-luminous display pixel is provided according to an embodiment of the present disclosure. FIG. 1 schematically illustrates a cross-sectional view of the self-luminous display pixel.

Referring to FIG. 1, the self-luminous display pixel may include a self-luminous circuit (not shown) disposed on a substrate 100. The self-luminous circuit may include a self-luminous device (not shown) and at least one TFT device (not shown). The self-luminous device may include a bottom electrode layer 121, a self-luminous semiconductor layer 122 and a top electrode layer 123, where the bottom electrode layer 121 may be a light blocking layer, and one or more TFT devices may be disposed in a region surrounded by a dashed frame A.

In some embodiment, the bottom electrode layer 121 may be made of a metal material, and the metal material may be a light blocking material, so as to ensure that the bottom electrode layer 121 is a light blocking layer.

In other embodiments, the bottom electrode may be made of other light blocking conductive materials.

In some embodiment, the self-luminous semiconductor layer 122 may have a multi-layer structure. For example, the self-luminous semiconductor layer 122 may be an Organic Light Emitting Diode (OLED) stacked layer, and the OLED stacked layer may have a multilayer structure including a hole injection layer, a light-emitting layer and an electron injection layer and so on.

With continued reference to FIG. 1, in some embodiment, the self-luminous display pixel may further include an optical fingerprint sensing circuit (not shown) disposed on the substrate 100. The optical fingerprint sensing circuit may include a first TFT device (not shown) and a photosensitive device (not shown). The first TFT device may include a source electrode (not shown), a drain electrode (not shown), a gate electrode layer 110 and a channel layer 111. The photosensitive device may include a photosensitive semiconductor layer (not shown). In some embodiment, the photosensitive semiconductor layer may be an inorganic PIN diode. Specifically, the photosensitive semiconductor layer may include a first semiconductor layer 116, a second semiconductor layer 115 and a third semiconductor layer 114 which are stacked from top to bottom. The photosensitive device may further include an upper electrode layer 117 disposed on the photosensitive semiconductor layer.

In some embodiment, the source electrode is a portion of a source electrode layer 112 shown in FIG. 1. Specifically, a portion of the source electrode layer 112 close to the channel layer 111 may serve as the source electrode and another portion of the source electrode layer 112 may serve as a conductive connection portion, so that the first TFT device can be electrically connected with other conductive structures (not shown), for example, data lines or scan lines etc. The drain electrode is a portion of a drain electrode layer 113 shown in FIG. 1. Specifically, a portion of the drain electrode layer 113 close to the channel layer 111 may serve as a drain electrode, another portion of the drain electrode layer 113 may serve as a lower electrode layer of the photosensitive device, and may be referred to as a drain electrode connecting layer (not shown), and the drain electrode connecting layer may be connected with the third semiconductor layer 114 of the photosensitive device, so that the drain electrode of the first TFT device can be electrically connected with the photosensitive device. And as mentioned later in this embodiment, the drain electrode connecting layer portion of the drain electrode layer 113 is also involved in forming a capacitor.

In some embodiment, the first semiconductor layer 116 may be a p-type silicon (p-Si) semiconductor layer, the second semiconductor layer 115 may be an i-type silicon (i-Si) semiconductor layer, and the third semiconductor layer 114 may be an n-type silicon (n-Si) semiconductor layer. That is, the three semiconductor layers constitute a PIN diode. In other embodiments, positions of the first semiconductor layer 116 and the third semiconductor layer 114 may be reversed.

In other embodiments, the photosensitive semiconductor layer may be an inorganic PN diode. In other embodiments, the photosensitive semiconductor layer may also be an organic PN diode or an organic PIN diode. When the photosensitive semiconductor layer is an inorganic PN diode or an inorganic PIN diode, the photosensitive semiconductor layer can be made relatively thin. Specifically, a thickness of the photosensitive semiconductor layer may be controlled within 0.5 μm. When the photosensitive semiconductor layer is an organic PN diode or an organic PIN diode, the photosensitive semiconductor layer may be thick. Specifically, a thickness of the photosensitive semiconductor layer may be controlled above 1 μm.

It should be noted that, although the self-luminous display pixel in the embodiment is disposed on the substrate 100, the substrate 100 itself normally does not belong to the self-luminous display pixel. In some embodiment, a plurality of the self-luminous display circuit shown in FIG. 1 and a plurality of existing optical fingerprint sensing circuits may be disposed on the substrate 100. The substrate 100 along with the self-luminous display pixels and other structures may constitute a display panel.

With continued reference to FIG. 1, the channel layer 111 of the first TFT device may be disposed right under a portion of the bottom electrode layer 121.

In some embodiment, the reasons why the channel layer 111 of the first TFT device is disposed right under a portion of the bottom electrode layer 121 lie in that: the channel layer 111 of the first TFT device is normally a semiconductor layer which is easily influenced by light; when the light radiates the channel layer 111, photoelectrons will be generated in the channel layer 111 and the channel layer 111 will be turned on, which may result in leakage of fingerprint photo-electronic signals temporarily stored in the photosensitive device; and the bottom electrode layer 121 is a light blocking layer, by setting the channel layer 111 to be disposed right under a portion of the bottom electrode layer 121, the bottom electrode layer 121 can block light and prevent the light from reaching the channel layer 111, thereby avoiding the above-mentioned signal leakage.

In addition, the bottom electrode layer 121 of the self-luminous device may be used to protect the channel layer 111 from light, so that additional structures and process steps may not be added, thereby saving cost.

In some embodiment, the channel layer 111 is disposed right under a portion of bottom electrode layer 121. That is, a portion of the bottom electrode layer 121 blocks an upper side of the channel layer 111 of the first TFT device. In other words, at least a portion of the bottom electrode layer 121 is disposed right above the channel layer 111 of the first TFT device. Then, an area of a top view of the bottom electrode layer 121 disposed above the channel layer 111 (including right above and obliquely above) may be set to be greater than an area of a top view of the channel layer 111, so as to ensure that a portion of the bottom electrode layer 121 can be disposed right above the channel layer 111, and another portion of the bottom electrode layer 121 can be disposed obliquely above the channel layer 111. The portion of the bottom electrode layer 121 disposed obliquely above the channel layer 111 can further protect the channel layer 111 from light, so as to better prevent the aforementioned signal leakage. Since the bottom electrode layer 121 is mainly disposed on a left side of the channel layer 111, an upper left side of the channel layer 111 is blocked by the bottom electrode layer 121; while even if an upper right side of the channel layer 111 is blocked by a small portion of the bottom electrode layer 121 as shown in FIG. 1, an area of the portion of the bottom electrode layer 121 is relatively small, thereby preventing the bottom electrode layer 121 from blocking too much area of the photosensitive semiconductor layer.

With continued reference to FIG. 1, the channel layer 111 of the first TFT device may be disposed under a portion of the photosensitive semiconductor layer. That is, a portion of the photosensitive semiconductor layer may be disposed right above the channel layer 111. The portion of the photosensitive semiconductor layer may be also disposed right under a portion of the bottom electrode layer 121. Therefore, in a vertical direction, the portion of the photosensitive semiconductor layer is disposed between the portion of the bottom electrode layer 121 and the channel layer 111.

From above, it can be seen that a portion of the photosensitive semiconductor layer is disposed right under a portion of the bottom electrode layer 121, another portion of the photosensitive semiconductor layer is not disposed right under the bottom electrode layer 121, and the two portions of the photosensitive semiconductor layer are separated by a dotted line as shown in FIG. 1. The portion of the photosensitive semiconductor layer not disposed under the bottom electrode layer 121 is also not disposed right above the channel layer 111.

In some embodiment, the channel layer 111 of the first TFT device is disposed right under a portion of the photosensitive semiconductor layer, where a portion of the photosensitive semiconductor layer is disposed right under a portion of the bottom electrode layer 121, and another portion of the photosensitive semiconductor layer is not disposed right under the bottom electrode layer 121. On one hand, a portion of the photosensitive semiconductor layer can be used to block the channel layer 111 of the first TFT device so as to prevent light from irradiating the channel layer 111 of the first TFT device. On the other hand, the portion of the photosensitive semiconductor layer not disposed right below the bottom electrode layer 121 can be used to increase a total area of the photosensitive semiconductor layer, thereby increasing an equivalent capacitance of the photosensitive device.

It should be noted that, although it is difficult to use the portion of the photosensitive semiconductor layer right under the bottom electrode layer 121 to receive light and to capture fingerprint images, the portion of the photosensitive semiconductor layer can increase a total area of the entire photosensitive semiconductor layer, thereby further increasing an equivalent capacitance of the photosensitive device. The larger the equivalent capacitance is, the larger a full well can be reached by the photosensitive device, and the larger an amount of electric charge can be temporarily stored in the photosensitive device, i.e., the larger an amount of photo-electronic signals can be temporarily stored in the photosensitive device. Then, more charge information can be temporarily stored in the photosensitive device, fingerprint image contrast can be increased correspondingly, and fingerprint image quality can be improved.

With continued reference to FIG. 1, the gate electrode layer 110 of the first TFT device is disposed under the channel layer 111. The optical fingerprint sensing circuit may further include an electrode layer 1100 disposed in the same layer as the gate electrode layer 110. The electrode layer 1100 is disposed under the photosensitive device. A first insulating layer 101 is disposed between the electrode layer 1100 and the drain electrode layer 113 of the photosensitive device. The electrode layer 1100 is connected with a common electrode (not shown), and the common electrode is connected with a constant potential.

In some embodiment, the gate electrode layer 110 may be disposed right under the channel layer 111. Therefore, the first TFT device has a bottom-gate structure. In a manufacturing process, the gate electrode layer 110 may be firstly formed, and then the channel layer 111 may be formed. The first TFT device may be formed by an amorphous silicon TFT process or an Indium Gallium Zinc Oxide (IGZO) process.

In some embodiment, the entire electrode layer 1100 may be disposed right under the photosensitive device. That is, the electrode layer 1100 exactly faces to the photosensitive device.

In other embodiments, a portion of the electrode layer may be disposed right under the photosensitive device, thereby ensuring that the electrode layer can at least partially face to the photosensitive device.

In the present embodiment, the electrode layer 1100 may be at least partially parallel to the photosensitive device.

It can be seen from the above that, the electrode layer 100 exactly faces to the photosensitive device, and the electrode layer 1100 is at least partially parallel to the photosensitive device. When the electrode layer 1100 exactly faces to and is at least partially parallel to the photosensitive device, and an insulating layer is disposed between the electrode layer 1100 and the drain electrode layer 113 of the photosensitive device, the electrode layer 1100 and the photosensitive device and a portion disposed therebetween can form a capacitor, the capacitor can increase an equivalent capacitance of the photosensitive device, and the larger the equivalent capacitance is, the larger a full well can be reached by the photosensitive device, and the larger an amount of electric charge can be temporarily stored in the photosensitive device, that is, the larger an amount of photo-electronic signals can be temporarily stored in the photosensitive device. Then, the photosensitive device can capture more light information, fingerprint image contrast can be increased correspondingly, and the fingerprint image quality can be improved.

It should be noted that, in the capacitor formed by the electrode layer 1100 and the photosensitive device and the portion disposed therebetween, an upper electrode of the capacitor mainly includes the lower electrode layer of the photosensitive device, i.e., the drain electrode connecting layer. This is because, as described above, besides a portion of the drain electrode layer 113 serves as the drain electrode of the first TFT device, another portion of the drain electrode layer 113 extends to one side, and the another portion of the drain electrode layer 113 mainly play a conductive connecting role, and serves as a lower electrode layer (i.e., the drain electrode connecting layer) of the photosensitive device for being connected with the third semiconductor layer 114 of the photosensitive device. In other word, the drain electrode layer 113 may include a drain electrode of the first TFT device and the lower electrode layer (i.e., the drain electrode connecting layer) of the photosensitive device. That is, a portion of the drain electrode layer 113 connected with the channel layer of the first TFT device semiconductor serves as the drain electrode of the first TFT device, and another portion of the drain electrode layer 113 connected with the third semiconductor layer of the photosensitive device semiconductor serves as the lower electrode layer of the photosensitive device, i.e., the drain electrode connecting layer.

In some embodiment, both the upper electrode layer 117 and the top electrode layer 123 are made of non-opaque conductive materials. The upper electrode layer 117 is connected with a first common electrode (not shown), and the first common electrode is connected with a first constant potential. The top electrode layer 123 is connected with a second common electrode (not shown), and the second common electrode is connected with a second constant potential. Since the top electrode layer 123 of the self-luminous device and the top electrode layer 117 of the photosensitive device are respectively connected with different constant potentials, each of the two devices can be stable and have a smaller electronic noise.

With continued reference to FIG. 1, in some embodiment, the gate electrode layer 110 is directly disposed on an upper surface of the substrate 100. Therefore, the electrode layer 1100 is also directly disposed on the upper surface of the substrate 100. The gate electrode layer 110 and the electrode layer 1100 can be made by a same process at a same time, thereby saving process steps as well as cost.

In some embodiment, the self-luminous display pixel may include the first insulating layer 101, and the first insulating layer 101 may cover the substrate 100, the gate electrode layer 110 and the electrode layer 1100. A portion of the first insulating layer 101 disposed between the gate electrode layer 110 and the channel layer 111 may serve as a gate dielectric layer of the first TFT device. Another portion of the first insulating layer 101 disposed between the electrode layer 1100 and the drain electrode layer 113 may serve as an insulating layer of the capacitor formed by the electrode layer 1100 and the lower electrode layer (i.e., the drain electrode connecting layer) of the photosensitive device. The source electrode layer 112, the drain electrode layer 113 and the channel layer 111 may be disposed on the first insulating layer 101.

In some embodiment, the self-luminous display pixel may further include a second insulating layer 102. The source electrode layer 112, the drain electrode layer 113 and the channel layer 111 may be covered by the second insulating layer 102. A portion of the third semiconductor layer 114 may penetrate the second insulating layer 102 to be electrically connected with the lower electrode layer (i.e., the drain electrode connecting layer) of the photosensitive device, i.e., the third semiconductor layer 114 may be connected with the drain electrode layer 113 of the first TFT device. In addition, a portion of the third semiconductor layer 114 may be disposed on an upper surface of the second insulating layer 102.

In some embodiment, the self-luminous display pixel may include a third insulating layer 103, where the third insulating layer 103 is disposed on the second insulating layer 102, and the photosensitive semiconductor layer is covered by the third insulating layer 103. Specifically, the third semiconductor layer 114 on the upper surface of the second insulating layer 102 is covered by the third insulating layer 103, and the second semiconductor layer 115, the first semiconductor layer 116 and the upper electrode layers 117 are all covered with the third insulating layer 103. A portion of the bottom electrode layer 121 is directly disposed on a top surface of the third insulating layer 103, and another portion of the bottom electrode layer 121 penetrates the third insulating layer 103 to be electrically connected with a TFT device circuit of the self-luminous circuit. As described above, a region surrounded by the dashed frame A shown in FIG. 1 represents an area where the TFT device of the self luminous circuit is disposed.

In some embodiment, the third insulating layer 103 may be referred to as a protective layer, and the photosensitive semiconductor layer is covered by the third insulating layer 103. Therefore, the third insulating layer 103 can protect the photosensitive semiconductor layer. It can be seen that, in a vertical direction, the optical fingerprint sensing circuit is disposed below the protective layer.

With continued reference to FIG. 1, in some embodiment, the self-luminous display pixel may further include a fourth insulating layer 104, where the fourth insulating layer 104 may be disposed on the third insulating layer 103, and cover the bottom electrode layer 121 disposed on the third insulating layer 103. The fourth insulating layer 104 may surround the self-luminous semiconductor layer 122 and the top electrode layer 123, and an upper surface of the fourth insulating layer 104 may be approximatively flush with an upper surface of the top electrode layer 123, or the upper surface of the fourth insulating layer 104 may be higher than the upper surface of the top electrode layer 123. That is, side walls of the self-luminous semiconductor layer 122 may be covered with the fourth insulating layer 104.

In some embodiment, each insulating layer may be made of silicon oxide, silicon nitride, or a combination thereof, or may be made of other materials.

In some embodiment, a portion of the third semiconductor layer 114 penetrates the second insulating layer 102, and a portion of the third semiconductor layer 114 is disposed on a top surface of the second insulating layer 102. An area of a top view of the portion of the third semiconductor layer 114 disposed on the upper surface of the second insulating layer 102 is greater than an area of a top view of the portion of the third semiconductor layer 114 penetrating the second insulating layer 102. As shown in FIG. 1, a width of the portion of the third semiconductor layer 114 disposed on the top surface of the second insulating layer 102 is greater than a width of the portion of the third semiconductor layer 114 penetrating the second insulating layer 102. An area of a top view of the second semiconductor layer 115 and an area of a top view of the first semiconductor layer 116 are generally equal to an area of a top view of the portion of the third semiconductor layer 114 disposed on the upper surface of the second insulating layer 102. This structure can ensure that an area of a top view of the photosensitive semiconductor layer is greater than an area of a top view of the portion of the third semiconductor layer 114 disposed in the second insulating layer 102, thereby increasing an area of the photosensitive semiconductor layer receiving light and facilitating obtaining fingerprint images of higher resolution.

It should be noted that, although not shown in the drawings, in some embodiment, a light blocking wall may be disposed between the self-luminous device and the photosensitive device, so as to avoid that light emitted from the self-luminous device directly irradiates the photosensitive device which may result in the light sensing device in a signal saturated state. Because the photosensitive device cannot absorb optical signals of fingerprint when being in the signal saturated state.

In the self-luminous display pixel according to the embodiment shown in FIG. 1, the light emitted from the self-luminous device can also be used as a light source for the photosensitive device to capture fingerprint. Therefore, it may be not necessary to configure a dedicated light source for the optical fingerprint sensing circuit, which can save cost and simplify structures. In addition, the aforementioned light blocking wall may be disposed between the photosensitive device and the self-luminous device to prevent the light emitted from the self-luminous device from reaching the photosensitive device before reaching a contact interface, where the contact interface refers to an interface between a surface pressed by a finger and the finger's epidermis.

It should be noted that, although not shown in the drawings, in some embodiment, a light-collimating layer may be disposed above the photosensitive device. Specifically, the light-collimating layer may be disposed above the portion of the photosensitive device not disposed right under the bottom electrode layer 121. The light-collimating layer may absorb light with large incident angles while allow only incident light at a vertical angle or a near-vertical angle (i.e., a maximum angle difference less than 10 degrees) to enter the photosensitive device, so as to improve definition of fingerprint images.

In the self-luminous display pixel according to the embodiment shown in FIG. 1, the self-luminous circuit and the optical fingerprint sensing circuit are disposed in the same self-luminous display pixel, so that the self-luminous display pixel cannot only support a display function, but also capture fingerprint images based on an optical principle. That is, the self-luminous display pixel can be applied to capture the fingerprint images, and realize a fingerprint identification function, which increases functions of the self-luminous display pixel, and makes the self-luminous display pixel highly integrated. In addition, in the self-luminous display pixel, the channel layer 111 of the first TFT device is disposed right under a portion of the bottom electrode layer 121, and the bottom electrode layer 121 is a light blocking layer, so that the bottom electrode layer 121 can be used to block light, so as to prevent light from reaching the channel layer 111 and further to avoid leakage of the captured fingerprint image signals.

Further, by setting the channel layer 111 of the first TFT device to be disposed right under a portion of the photosensitive semiconductor layer, setting a portion of the photosensitive semiconductor layer to be disposed right under a portion of the bottom electrode layer 121, and setting another portion of the photosensitive semiconductor layer to be not disposed right under the bottom electrode layer 121, on one hand, a portion of the photosensitive semiconductor layer can be used to further block the channel layer 111 of the first TFT device, so as to further prevent light from irradiating the channel layer 111 of the first TFT device; on the other hand, the portion of photosensitive semiconductor layer right under the bottom electrode layer 121 can increase a total area of the photosensitive semiconductor layer, so that an equivalent capacitance of the photosensitive device can be increased. Therefore, more charge signals can be temporarily stored in the photosensitive device, fingerprint image contrast can be correspondingly increased, and quality of the captured fingerprint images can also be improved.

Further, an electrode layer 1100 is disposed on a same layer with a gate electrode layer 110, and the electrode layer 1100 is disposed right under the photosensitive device. A first insulating layer 101 is disposed between the electrode layer 1100 and a drain electrode layer 113 of the photosensitive device. The electrode layer 1100 is at least partially parallel to the photosensitive device. In this way, the electrode layer 1100 and the photosensitive device and a portion disposed therebetween can form a capacitor, which increases an equivalent capacitance of the photosensitive device, so that more charge signals can be temporarily stored in the photosensitive device, fingerprint image contrast can be correspondingly increased, and quality of the captured fingerprint images can also be improved.

Further, an upper electrode layer 117 of the photosensitive device is connected with a first common electrode, and the first common electrode is connected with a first constant potential. A top electrode layer 123 of a self-luminous device is connected with a second common electrode, and the second common electrode is connected with a second constant potential. Since the top electrode layer 123 of the self-luminous device and the upper electrode layer 117 of the photosensitive device are respectively connected with different constant potentials, each of the two devices can be stable and have a smaller electronic noise.

Further, light emitted from the self-luminous circuit may be used as a light source for the optical fingerprint sensing circuit to capture fingerprint images. Therefore, it may be not necessary to configure a dedicated light source for the optical fingerprint sensing circuit, thereby saving cost and simplifying the structure.

Figure 2:
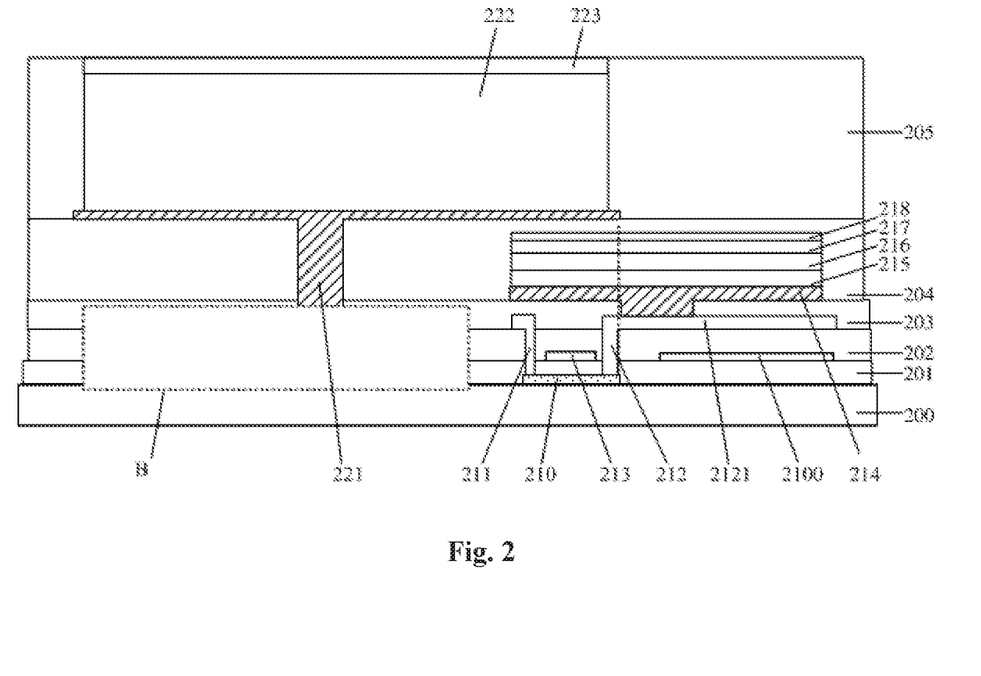
FIG. 2 schematically illustrates a cross-sectional view of a self-luminous display pixel according to another embodiment.

A self-luminous display pixel is provided according to another embodiment of the present disclosure. FIG. 2 schematically illustrates a cross-sectional view of the self-luminous display pixel.

Referring to FIG. 2, in some embodiment, the self-luminous display pixel may include a self-luminous circuit (not shown) disposed on the substrate 200. The self-luminous circuit may include a self-luminous device (not shown) and at least one TFT device (not shown). The self-luminous device may include a bottom electrode layer 221, a self-luminous semiconductor layer 222 and a top electrode layer 223, where the bottom electrode layer 221 may be a light blocking layer. One or more TFT devices may be disposed in a region surrounded by a dashed frame B.

In some embodiment, the self-luminous display pixel may further include an optical fingerprint sensing circuit (not shown) disposed on the substrate 200. The optical fingerprint sensing circuit may include a first TFT device (not shown) and a photosensitive device (not shown). The first TFT device may include a source electrode (not shown), a drain electrode (not shown), a gate electrode layer 213 and a channel layer 210, where the source electrode is a portion of a source electrode layer 211 shown in FIG. 2, and the drain electrode is a portion of a drain electrode layer 212 shown in FIG. 2. The photosensitive device may include a photosensitive semiconductor layer (not shown). In some embodiment, the photosensitive semiconductor layer may be an inorganic PIN diode. Specifically, the photosensitive semiconductor layer may include a first semiconductor layer 217, a second semiconductor layer 216 and a third semiconductor layer 215. The photosensitive device may further include an upper electrode layer 218 disposed on an upper surface of the photosensitive semiconductor layer and a lower electrode layer 214 disposed on a lower surface of the photosensitive semiconductor layer.

In some embodiment, the channel layer 210 of the first TFT device may be disposed right under a portion of the bottom electrode layer 221.

In some embodiment, the bottom electrode layer 221 is a light blocking layer. By setting the channel layer 210 right under a portion of the bottom electrode layer 221, the bottom electrode layer 221 can be used to block light to prevent the light from reaching the channel layer 210, thereby avoiding signal leakage of photosensitive device. In addition, the bottom electrode layer 221 of the self-luminous device is used to protect the channel layer 210 from light, so that additional structures and additional process steps may not be added, and cost can be saved.

In some embodiment, the channel layer 210 is disposed right under a portion of the bottom electrode layer 221, that is, a portion of the bottom electrode layer 221 is disposed right above the channel layer 10 of the first TFT device. An area of the bottom electrode layer 221 disposed above (including right above and obliquely above) the channel layer 210 may be greater than an area of the channel layer 210, so as to ensure that a portion of the bottom electrode layer 221 is disposed right above the channel layer 210, and another portion of the bottom electrode layer 221 is disposed obliquely above the channel layer 210. The another portion of the bottom electrode layer 221 disposed obliquely above the channel layer 210 can further protect the channel layer 210 from light so as to better prevent the aforementioned signal leakage.

With continued reference to FIG. 2, the channel layer 210 of the first TFT device may be also disposed right under a portion of the photosensitive semiconductor layer, that is, a portion of the photosensitive semiconductor layer may be disposed right above the channel layer 210, and the portion of the photosensitive semiconductor layer may be also disposed right under a portion of the bottom electrode layer 221. Therefore, in a vertical direction, the portion of the photosensitive semiconductor layer may be disposed between the portion of the bottom electrode layer 221 and the channel layer 210.

It can be seen from the above that, a portion of the photosensitive semiconductor layer is disposed right under a portion of the bottom electrode layer 221, another portion of the photosensitive semiconductor layer is not disposed right under the bottom electrode layer 221, and the two portions of the photosensitive semiconductor layer are separated by a dashed line as shown in FIG. 2. The portion of the photosensitive semiconductor layer not disposed under the bottom electrode layer 221 is also not disposed right above the channel layer 210.

With the above arrangement, on the one hand, a portion of the photosensitive semiconductor layer can be used to further block the channel layer 210 of the first TFT device so as to further prevent the light from irradiating the channel layer 210 of the first TFT device. On the other hand, another portion of the photosensitive semiconductor layer not disposed right under the bottom electrode layer 221 can be used for capturing a fingerprint image.

In some embodiment, the gate electrode layer 213 of the first TFT device is disposed above the channel layer 210 and the gate electrode layer 213 itself has a certain light blocking property. Therefore, the gate electrode layer 213 can be directly used to prevent light from irradiating the channel layer 210 of the first TFT device. In addition, in this embodiment, the channel layer 210 of the first TFT is disposed right under a portion of the photosensitive semiconductor layer as well as a portion of the bottom electrode layer 221, so as to achieve a better light blocking effect. It should be noted that, in other embodiments, the gate electrode layer of the first TFT device may also be made of a non-opaque conductive material, and light blocking may be achieved by virtue of the portion of the photosensitive semiconductor layer and the portion of the bottom electrode layer disposed right above the channel layer.

It should be noted that, although the photosensitive semiconductor layer right under the bottom electrode layer 221 cannot receive light or be used for capturing a fingerprint image, the portion of the photosensitive semiconductor layer can increase a total area of the entire photosensitive semiconductor layer, thereby further increasing an equivalent capacitance of the photosensitive semiconductor layer. Then, more charge information can be temporarily stored in the photosensitive device, fingerprint image contrast can be increased correspondingly, and fingerprint image quality can be improved.

With continued reference to FIG. 2, the gate electrode layer 213 of the first TFT device is disposed above the channel layer 210 with a first insulating layer 201 disposed therebetween. A second insulating layer 202 is disposed on the first insulating layer 201. A portion of the drain electrode layer 212 penetrates the first insulating layer 201 and the second insulating layer 202, and a portion of the drain electrode layer 212 is disposed on an upper surface of the second insulating layer 202. The portion of the drain electrode layer 212 disposed on the upper surface of the second insulating layer 202 is further referred to as a drain electrode connecting layer 2121 as shown in FIG. 2. That is, the drain electrode connecting layer 2121 is a portion of the drain electrode layer 212 disposed on the upper surface of the second insulating layer 202.

In some embodiment, the gate electrode layer 213 of the first TFT device may be disposed above the channel layer 210. That is, the first TFT device may have a top-gate structure, and the channel layer 210 may be firstly made and then the gate electrode layer 213 may be made, where the first TFT device may be made by a low-temperature polysilicon TFT process or a high-temperature polysilicon TFT process.

In some embodiment, the optical fingerprint sensing circuit may further include an electrode layer 2100 disposed on the same layer as the gate electrode layer 213, where the electrode layer 2100 may be disposed under the photosensitive device. A second insulating layer 202 may be disposed between the electrode layer 2100 and the drain electrode connecting layer 2121. The electrode layer 2100 may be connected with a common electrode (not shown), and the common electrode may be connected with a constant potential.

In some embodiment, the electrode layer 2100 may be disposed under the photosensitive device. Therefore, the electrode layer 2100 faces to the photosensitive semiconductor layer of the photosensitive device. And, the electrode layer 2100 is at least partially parallel to the lower electrode layer 214 of the photosensitive device. When the lower electrode layer 214 of the photosensitive device at least partially faces to the electrode layer 2100 and an insulating layer is disposed between the electrode layer 2100 and the lower electrode layer 214 of the photosensitive device, the electrode layer 2100 and the lower electrode layer 214 of the photosensitive device and a portion disposed therebetween can form a capacitor, and the capacitor can increase an equivalent capacitance of the photosensitive device. The larger the equivalent capacitance is, the larger a full well can be reached by the photosensitive device, and the larger an amount of electric charge can be temporarily stored in the photosensitive device, i.e., the larger an amount of photoelectronic signals can be temporarily stored in the photosensitive device. Then, the photosensitive device can capture more optical information, fingerprint image contrast can be increased correspondingly, and fingerprint image quality can be improved.

It should be noted that, in the capacitor formed by the electrode layer 2100 and the lower electrode layer 214 and the portion disposed therebetween, an upper electrode of the capacitor mainly includes the photosensitive device (this portion is also desired as the upper electrode), but also includes a portion of the drain electrode connecting layer 2121, because the drain electrode connecting layer 2121 is electrically connected with the lower electrode layer 214 of the photosensitive device, and the drain electrode connecting layer 2121 is at least partially disposed above the electrode layer 2100.

In some embodiment, the channel layer 210 is disposed directly on a portion of an upper surface of the substrate 200, the first insulating layer 201 covers the channel layer 210 and other portions of the upper surface of the substrate 200, and the gate electrode layer 213 and the electrode layer 2100 are disposed on an upper surface of the first insulating layer 201.

In some embodiment, both the upper electrode layer 218 and the top electrode layer 223 are made of a non-opaque conductive material. The upper electrode layer 218 is connected with a first common electrode (not shown), and the first common electrode is connected with a first constant potential. The top electrode layer 223 is connected with a second common electrode (not shown), and the second common electrode is connected with a second constant potential. The top electrode layer 223 of the self-luminous device and the top electrode layer 218 of the photosensitive device are respectively connected with different constant potentials so as to ensure that each of the two devices is stable.

With continued reference to FIG. 2, the self-luminous display pixel may include the first insulating layer which covers the substrate 200 and the channel layer 210. A portion of the first insulating layer 201 disposed between the channel layer 210 and the gate electrode layer 213 serves as a gate dielectric layer of the first TFT device.

In some embodiment, the self-luminous display pixel may further include a second insulating layer 202. The gate electrode layer 213 and the electrode layer 2100 are covered by the second insulating layer 202. A portion of the second insulating layer 202 disposed between the electrode layer 2100 and the drain electrode connecting layer 2121 serves as an insulating layer of the capacitor formed by the electrode layer 2100 and the photosensitive device and the portion disposed therebetween. A portion of the source electrode layer 211 may penetrate the first insulating layer 201 and the second insulating layer 202, and another portion of the source electrode layer 211 may be disposed on the upper surface of the second insulating layer 202. Similarly, a portion of the drain electrode layer 212 may penetrate the first insulating layer 201 and the second insulating layer 202, and another portion of the drain electrode layer 212 may be disposed on an upper surface of the second insulating layer 202. It should be noted that, the another portion of the drain electrode layer 212 is the aforementioned drain electrode connecting layer 2121.

In some embodiment, the self-luminous display pixel may further include a third insulating layer 203, where the third insulating layer 203 may be disposed on the second insulating layer 202. A portion of the lower electrode layer 214 may penetrate the third insulating layer 203 so as to be electrically connected with the drain electrode connecting layer 2121, and another portion of the lower electrode layer 214 may be disposed on an upper surface of the third insulation layer 203.

In some embodiment, the third insulating layer 203 may be referred to as a TFT protective layer, that is, the self-luminous display pixel may further include a TFT protective layer. Then, the first TFT device may be covered by the TFT protective layer, and both the photosensitive semiconductor layer and the self-luminous semiconductor layer 222 may be disposed above an upper surface of the TFT protective layer. In other embodiments, the photosensitive semiconductor layer and the self-luminous semiconductor layer may be disposed over the TFT protective layer with other structures disposed therebetween.

In some embodiment, the self-luminous display pixel may further include a fourth insulating layer 204, where the photosensitive semiconductor layer may be covered by the fourth insulating layer 204. Specifically, the lower electrode layer 214 disposed on the upper surface of the third insulating layer 203 may be covered by the fourth insulating layer 204, and the third semiconductor layer 215, the second semiconductor layer 216, the first semiconductor layer 217 and the upper electrode layer 218 may be all covered by the fourth insulating layer 204. A portion of the bottom electrode layer 221 may be directly disposed on an upper surface of the fourth insulating layer 204, and another portion of the bottom electrode layer 221 may penetrate the fourth insulation layer 204 to be electrically connected with a TFT device circuit in the self-luminous circuit. As described above, a region surrounded by the dashed line B shown in FIG. 2 represents an area where the TFT device is disposed in the self-luminous circuit.

In some embodiment, the self-luminous display pixel may further include a fifth insulating layer 205, where the fifth insulating layer 205 may be disposed on the fourth insulating layer 204 and may cover the bottom electrode layer 221 on the fourth insulating layer 204. The fifth insulating layer 205 may surround the self-luminous semiconductor layer 222 and the top electrode layer 223, and a top surface of the fifth insulating layer 205 may be approximatively flush with a top surface of the top electrode layer 223. In other embodiments, the top surface of the fifth insulating layer may be higher than the top surface of the top electrode layer.

In some embodiment, the lower electrode layer 214 may be directly connected with the drain electrode connecting layer 2121, and then the third semiconductor layer 215, the second semiconductor layer 216, the first semiconductor layer 217 and the upper electrode layer 218 and other structures may be formed on the upper surface of the lower electrode layer 214.

In some embodiment, the channel layer 210 of the first TFT device may be disposed under a portion of the lower electrode layer 214, and the lower electrode layer 214 may be a light-blocking layer, so as to further prevent light from entering the channel layer 210 by virtue of the lower electrode layer 214, and further to avoid signal leakage occurrence in the optical fingerprint sensing circuit.

In some embodiment, a portion of the lower electrode layer 214 may penetrate the third insulating layer 203, and a portion of the lower electrode layer 214 may be disposed on an upper surface of the third insulating layer 203. An area of a top view of the portion of the lower electrode layer 214 disposed on the upper surface of the third insulating layer 102 may be greater than an area of a top view of a portion of the lower electrode layer 214 penetrating the second insulating layer 203. As shown in FIG. 2, a width of the portion of the lower electrode layer 214 disposed on the upper surface of the third insulating layer 203 is greater than a width of the portion of the lower electrode layer 214 penetrating the third insulating layer 203. This structure can ensure that an area of a top view of the photosensitive semiconductor layer is greater than an area of a top view of the portion of the lower electrode layer 214 disposed in the third insulating layer 203.

It should be noted that, although not shown in the drawings, in some embodiment, a light blocking wall may be disposed between the self-luminous device and the photosensitive device. A light-collimating layer may be disposed above the photosensitive device. Specifically, the light-collimating layer may be disposed above the portion of the photosensitive device not disposed right under the bottom electrode layer 221.

For more information on structures, properties and advantages of the self-luminous display pixel in the embodiment shown in FIG. 2, reference may be made to corresponding descriptions in the foregoing embodiments.

Figure 3:
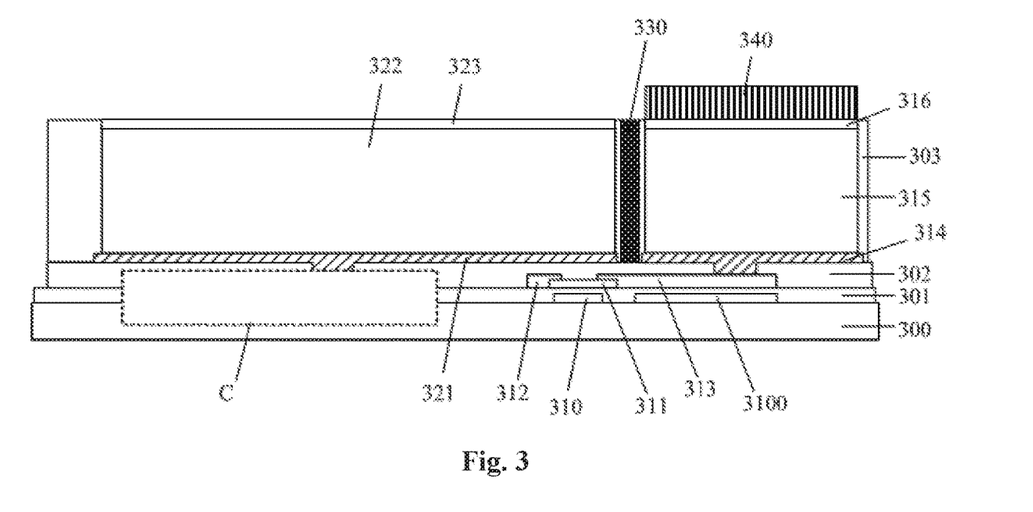
FIG. 3 schematically illustrates a cross-sectional view of a self-luminous display pixel according to another embodiment.

A self-luminous display pixel may be provided according to another embodiment of the present disclosure. Referring to FIG. 3, FIG. 3 schematically illustrates a cross-sectional view of the self-luminous display pixel.

Referring to FIG. 3, the self-luminous display pixel may include a self-luminous circuit (not shown) on a substrate 300. In some embodiment, the self-luminous circuit may include a self-luminous device (not shown) and at least one TFT device (not shown). The self-luminous device may include a bottom electrode layer 321, a self-luminous semiconductor layer 322 and a top electrode layer 323, where the bottom electrode layer 321 may be a light blocking layer. One or more TFT devices may be disposed in a region surrounded by a dashed frame C shown in FIG. 3.

In some embodiment, the self-luminous semiconductor layer 322 may have a multi-layer structure. For example, the self-luminous semiconductor layer 322 may be an OLED stacked layer, and the OLED stacked layer may normally include a hole injection layer, a light-emitting layer and an electron injection layer and so on.

With continued reference to FIG. 3, in some embodiment, the self-luminous display pixel may further include an optical fingerprint sensing circuit (not shown) disposed on the substrate 300. The optical fingerprint sensing circuit may include a first TFT device (not shown) and a photosensitive device (not shown). The first TFT device may include a source electrode (not shown), a drain electrode (not shown), a gate electrode layer 310 and a channel layer 311, where the source electrode may be a portion of a source electrode layer 312 shown in FIG. 3, and the drain electrode may be a portion of the drain electrode layer 313 shown in FIG. 3. The photosensitive device may include a photosensitive semiconductor layer 315, and may further include a lower electrode layer 314 under the photosensitive semiconductor layer 315 and an upper electrode layer 316 above the photosensitive semiconductor layer 315.

In some embodiment, the lower electrode layer 314 may be a light blocking layer, and may be made of a metal material.

In some embodiment, the photosensitive semiconductor layer 315 may be a semiconductor stacked layer including an organic photosensitive layer. When the self-luminous semiconductor layer 322 is an OLED stacked layer, the self-luminous semiconductor layer 322 may be a semiconductor stacked layer including an organic light-emitting layer. In addition, the photosensitive semiconductor layer 315 and the self-luminous semiconductor layer 322 may be disposed in a same layer, i.e. at a same level.

When the photosensitive semiconductor layer 315 and the self-luminous semiconductor layer 322 are disposed at the same level, an upper surface of the lower electrode layer 314 and an upper surface of the bottom electrode layer 321 are also disposed at the same level. Therefore, the lower electrode layer 314 and the bottom electrode layer 321 may be formed simultaneously using the same process steps, thereby saving process steps and cost. In addition, some layers of the photosensitive device (i.e. the lower electrode layer 314, the photosensitive semiconductor layer 315 or the upper electrode layer 316) and the self-luminous device (i.e. the bottom electrode layer 321, the self-luminous semiconductor layer 322 or the top electrode layer 323) may be formed simultaneously in the same process, thereby saving process steps and cost.

In other embodiments, when the photosensitive semiconductor layer and the self-luminous semiconductor layer are in a same layer, the photosensitive semiconductor layer may be an inorganic semiconductor layer, for example, an inorganic PIN diode or an inorganic PN diode.

With continued reference to FIG. 3, the channel layer 311 of the first TFT device may be disposed right under a portion of the bottom electrode layer 321.

In some embodiment, the channel layer 311 of the first TFT device may be disposed right under a portion of the bottom electrode layer 321, and the bottom electrode layer 321 may be a light blocking layer. Therefore, the bottom electrode layer 321 can be used to block light and to prevent the light from reaching the channel layer 311, and further to avoid occurrence of signal leakage in the photosensitive device. In addition, the bottom electrode layer 321 of the self-luminous device may be used to protect the channel layer 311 from light, so that additional structures and process steps may be not added, and cost can be saved.

In this embodiment, the channel layer 311 is disposed right under a portion of the bottom electrode layer 321, that is, the portion of the bottom electrode layer 321 blocks an upward side of the channel layer 311 of the first TFT device. In other words, at least a portion of the bottom electrode layer 321 is disposed right above the channel layer 311. Then, an area of the bottom electrode layer 321 above (including right above and obliquely above) the channel layer 311 may be greater than an area of the channel layer 311, so as to ensure that a portion of the bottom electrode layer 321 is disposed right above the channel layer 311, and another portion of the bottom electrode layer 321 is disposed obliquely above the channel layer 311. The another portion of the bottom electrode layer 321 obliquely above the channel layer 311 can further protect the channel layer 311 from light to better avoid occurrence of the aforementioned signal leakage.

In this embodiment, a portion of the lower electrode layer 314 is disposed on an upper right side of the channel layer 311, and the lower electrode layer 314 is a light blocking layer. Therefore, the lower electrode layer 314 can further prevent light from irradiating the channel layer 311.

With continued reference to FIG. 3, in some embodiment the gate electrode layer 310 of the first TFT device may be disposed under the channel layer 311. The optical fingerprint sensing circuit may further include an electrode layer 3100 disposed in the same layer as the gate electrode layer 310, where the electrode layer 3100 may be disposed under the photosensitive device, and a first insulating layer 301 may be disposed between the electrode layer 3100 and the drain electrode layer 313 of the photosensitive device. The electrode layer 3100 may be connected with a common electrode (not shown), and the common electrode may be connected with a constant potential.

In some embodiment, the electrode layer 3100 may be disposed right under the photosensitive device. Therefore, the entire electrode layer 3100 faces to the photosensitive device.

In other embodiments, a portion of the electrode layer may be disposed right under the photosensitive device, thereby ensuring that the electrode layer can at least partially face to the photosensitive device.

In some embodiment, the electrode layer 3100 may be at least partially parallel to the photosensitive device. When the electrode layer 3100 exactly faces to and is at least partially parallel to the photosensitive device, and an insulating layer is disposed between the electrode layer 3100 and the drain electrode layer 313 of the photosensitive device, the electrode layer 3100 and the photosensitive device and a portion disposed therebetween can form a capacitor, where the capacitor can increase an equivalent capacitance of the photosensitive device, and the larger the equivalent capacitance is, the larger a full well can be reached by the photosensitive device, and the larger an amount of electric charge can be temporarily stored in the photosensitive device, that is, the larger an amount of photo-electronic signals can be temporarily stored in the photosensitive device. Then, the photosensitive device can capture more light information, fingerprint image contrast can be increased correspondingly, and the fingerprint image quality can be improved.

It should be noted that, in the capacitor formed by the electrode layer 3100 and the photosensitive device and the portion disposed therebetween, an upper electrode of the capacitor mainly includes the photosensitive device (this portion is also desired as the upper electrode), but also includes a portion of the drain electrode layer 313. This is because, as described above, besides a portion of the drain electrode layer 313 serves as the drain electrode of the first TFT device, another portion of the drain electrode layer 313 extends to one side, and the another portion of the drain electrode layer 313 mainly play a conductive connecting role, and is also referred to as a drain electrode connecting layer (not shown, reference can be made to corresponding descriptions in the aforementioned embodiments). As shown in FIG. 3, the another portion of the drain electrode layer 313 is directly connected with the louver electrode layer 314 of the photosensitive device, and the electrode layer 3100 is also disposed right under the another portion of the drain electrode layer 313. Therefore, when a capacitor is formed between the electrode layer 3100 and the photosensitive device, the another portion of the drain electrode layer 313 may also serve as a portion of an upper electrode of the capacitor.

In some embodiment, both the upper electrode layer 316 and the top electrode layer 323 may be made of a non-opaque conductive material. The upper electrode layer 316 may be connected with a first common electrode (not shown), and the first common electrode may be connected with a first constant potential. The top electrode layer 323 may be connected with a second common electrode (not shown), and the second common electrode may be connected with a second constant potential. Since the top electrode layer 323 of the self-luminous device and the top electrode layer 316 of the photosensitive device are respectively connected with different constant potentials, each of the two devices can be stable and have a smaller electronic noise.

With continued reference to FIG. 3, in some embodiment, the gate electrode layer 310 may be disposed directly on an upper surface of the substrate 300. Therefore, the electrode layer 3100 may be also directly formed on the upper surface of the substrate 300. The gate electrode layer 310 and the electrode layer 3100 may be made simultaneously using the same process, thereby saving process steps and cost.

In some embodiment, the self-luminous display pixel may include the first insulating layer 301, and the first insulating layer 301 may cover the substrate 300, the gate electrode layer 310 and the electrode layer 3100. A portion of the first insulating layer 301 disposed between the gate electrode layer 310 and the channel layer 311 may serve as a gate dielectric layer of the first TFT device. Another portion of the first insulating layer 301 disposed between the electrode layer 3100 and the drain electrode layer 313 may serve as an insulating layer of the capacitor formed by the electrode layer 3100 and the photosensitive device. The source electrode layer 312, the drain electrode layer 313 and the channel layer 311 may be disposed on the first insulating layer 301.

In some embodiment, the self-luminous display pixel may further include a second insulating layer 302. The source electrode layer 312, the drain electrode layer 313 and the channel layer 311 may be covered by the second insulating layer 302. A portion of the lower electrode layer 314 may penetrate the second insulating layer 302 so as to be electrically connected with the drain electrode layer 313, i.e., the lower electrode layer 314 may be directly connected with the drain electrode layer 313 of the first TFT device. In addition, a portion of the lower electrode layer 314 may be disposed on an upper surface of the second insulating layer 302, a portion of the bottom electrode layer 321 may be directly disposed on the upper surface of the second insulating layer 302, and another portion of the bottom electrode layer 321 may penetrate the second insulating layer 302 so as to be electrically connect with a second TFT device circuit. As shown in FIG. 3, a region surrounded by a dashed frame C indicates an area where the second TFT device may be disposed.

In some embodiment, the self-luminous display pixel may further include a third insulating layer 303, where the third insulating layer 303 may be disposed on the second insulating layer 302. A portion of the lower electrode layer 314 disposed on an upper surface of the second insulating layer 302 is covered by the third insulating layer 303, and a portion of the bottom electrode layer 321 disposed on the upper surface of the second insulating layer 302 is also covered by the third insulating layer 303. In addition, the third insulating layer 303 may surround the self-luminous semiconductor layer 322 and the top electrode layer 323, and a top surface of the third insulating layer 303 may be approximatively flush with a top surface of the top electrode layer 323. In other embodiments, the top surface of the third insulating layer may be higher the top surface of the top electrode layer 323. The third insulating layer 303 may surround the photosensitive semiconductor layer 315 and the upper electrode layer 316, and an upper surface of the third insulating layer 303 may be approximatively flush with an upper surface of the upper electrode layer 316. In other embodiments, the upper surface of the third insulating layer may be higher than the upper surface of the upper electrode layer. Sidewalls of the self-luminous semiconductor layer 322 and sidewalls of the photosensitive semiconductor layer 315 may be covered by the third insulating layer 303.

In some embodiment, the second insulating layer 302 may be referred to as a TFT protective layer, that is, the self-luminous display pixel may further include a TFT protective layer. Then, the first TFT device may be covered by the TFT protective layer, and at least a portion of the photosensitive semiconductor layer 315 and at least a portion of the self-luminous semiconductor layer 322 may be disposed above an upper surface of the TFT protective layer.

In some embodiment, a portion of the lower electrode layer 314 may penetrate the second insulating layer 302, and another portion of the lower electrode layer 314 may be disposed on an upper surface of the second insulating layer 302. An area of a top view of the portion of the lower electrode layer 314 disposed on the upper surface of the second insulating layer 302 may be greater than an area of a top view of a portion of the lower electrode layer 314 penetrating the second insulating layer 302. As shown in FIG. 3, a width of the portion of the lower electrode layer 314 disposed on the upper surface of the second insulating layer 302 is greater than a width of the portion of the lower electrode layer 314 penetrating the second insulating layer 302. An area of a top view of the photosensitive semiconductor layer 315 may be basically equal to an area of a top view of the lower electrode layer 314. This structure can ensure that an area of a top view of the photosensitive semiconductor layer is greater than an area of a top view of the portion of the lower electrode layer 314 disposed in the second insulating layer 302, so as to increase an area of the photosensitive semiconductor layer 315 receiving light and to facilitate obtaining fingerprints images with higher resolution.

In some embodiment, a light blocking wall 330 may be disposed between the self-luminous device and the photosensitive device. Specifically, the light blocking wall 330 may be disposed in the third insulating layer 303, and a height of the light blocking wall 330 may be approximatively the same as a thickness of the third insulating layer 303.

In the embodiment shown in FIG. 3, the light emitted from the self-luminous device can also be used as a light source for the photosensitive device to capture fingerprint. Therefore, it may be not necessary to configure a dedicated light source for the optical fingerprint sensing circuit, which can save cost and simplify the structure. In addition, the aforementioned light blocking wall 330 may be disposed between the photosensitive device and the self-luminous device to prevent the light emitted from the sell-luminous device from reaching the photosensitive device before reaching a contact interface, where the contact interface refers to an interface between a surface pressed by a finger and the finger's epidermis.

In this embodiment, the light blocking wall 330 may be disposed on an upper right side of the channel layer 311, and the light blocking wall 330 can block light and prevent the light from entering the channel layer 311.

With continued reference to FIG. 3, in some embodiment, a light-collimating layer 340 may be disposed over the photosensitive device, and may be disposed on the upper electrode layer 316. The light collimating layer 340 at least partially absorbs light propagating downward from obliquely above, while allows light at a vertical angle or a near-vertical angle (a maximum angle difference is less than 10 degrees) to pass through the light collimating layer 340 and to enter the photosensitive device.

Although not shown in FIG. 3, in some embodiment, the light-collimating layer 340 may include light blocking regions and non-opaque regions arranged at intervals, where the non-opaque regions may be non-opaque in a vertical direction, and each of the non-opaque regions may be in an elongated stripe shape arranged in the vertical direction. Specifically, each of the non-opaque regions may be a non-opaque hole and each of the light blocking regions may be a light blocking frame. Since the non-opaque regions are elongated regions, and the light blocking regions surround the non-opaque regions, when stray light irradiates the light-collimating layer 340, the light blocking regions will block and absorb much light with oblique incident angles, while allow only light at a vertical angle or a near-vertical angle (a maximum angle difference is less than 10 degrees) to pass through the light collimating layer 340, thereby realizing a light collimating effect.

In the self-luminous display pixel according to the embodiment shown in FIG. 3, at least a portion of the photosensitive semiconductor layer 315 and at least a portion of the self-luminous semiconductor layer 322 may be disposed above the upper surface of the TFT protective layer, and the photosensitive semiconductor layer 315 may be disposed on the lower electrode layer 314. An area of a top view of the portion of the lower electrode layer 314 disposed on the top surface of the second insulating layer 302 is greater than an area of a top view of the portion of the lower electrode layer 314 penetrating the second insulating layer 302. An area of a top view of the photosensitive semiconductor layer 315 is generally equal to an area of a top view of the lower electrode layer 314. This structure can ensure that an area of a top view of the photosensitive semiconductor layer 315 is greater than an area of a top view of the portion of the lower electrode layer 314 disposed in the second insulating layer 302, thereby increasing an area of the photosensitive semiconductor layer receiving light and facilitating obtaining fingerprint images with higher resolution.

For more information on structures, properties and advantages of the self-luminous display pixels in the embodiment shown in FIG. 3, reference may be made to corresponding descriptions in the foregoing embodiments.

Figure 4:
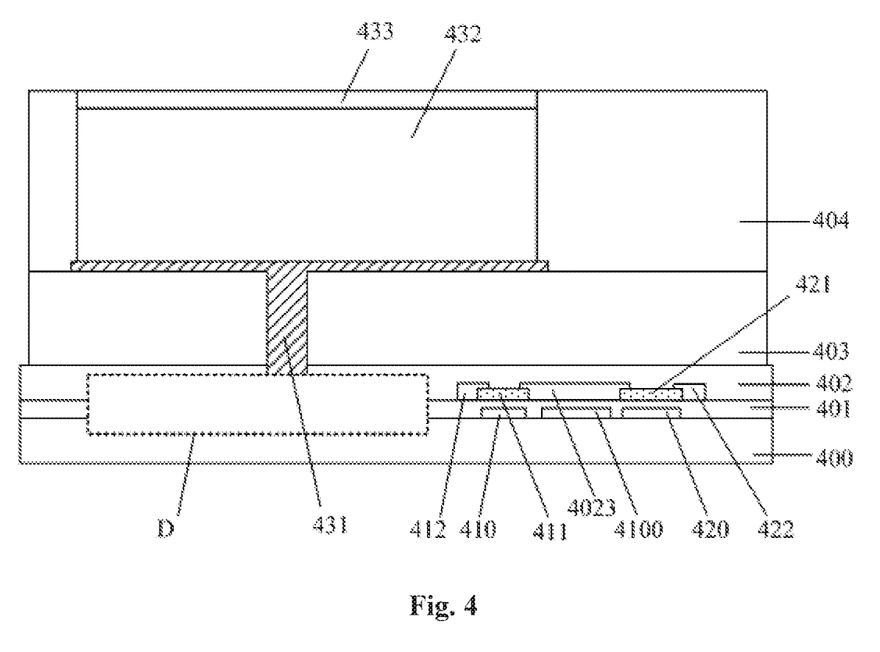
FIG. 4 schematically illustrates a cross-sectional view of a self-luminous display pixel according to another embodiment.

A self-luminous display pixel is also provided according to another embodiment of the present disclosure. FIG. 4 schematically illustrates a cross-sectional view of the self-luminous display pixel.

Referring to FIG. 4, the self-luminous display pixel may include a self-luminous circuit (not shown) disposed on a substrate 400. The self-luminous circuit may include at least one TFT device (not shown) and a self-luminous device (not shown). The self-luminous device may include a bottom electrode layer 431, a self-luminous semiconductor layer 432 and a top electrode layer 433, where the bottom electrode layer 431 may be a light-blocking layer. One or more TFT devices of the self-luminous circuit may be disposed in a region surrounded by a dashed frame D.

In some embodiment, the self-luminous semiconductor layer 432 may have a multi-layer structure. For example, the self-luminous semiconductor layer 432 may be an OLED stacked layer, where the OLED stacked layer may include a hole injection layer, a light-emitting layer and an electron injection layer and so on.

In some embodiment, the self-luminous display pixel may further include an optical fingerprint sensing circuit (not shown) disposed on the substrate 400, where the optical fingerprint sensing circuit may include a first TFT device (not shown) and a photosensitive device (not shown), and the first TFT device may include a source electrode (not shown), a drain electrode (not shown), a gate electrode layer 410 and a channel layer 411.

In some embodiment, the self-luminous display pixel may further include a second TFT device, where the photosensitive device may be the second TFT device. The second TFT device may include a source electrode, a drain electrode, a gate electrode layer 420 and a channel layer 421, where the channel layer 421 of the second TFT device may be a region where the optical fingerprint sensing circuit receives light reflected by a finger. That is, in this embodiment, a photosensitive structure of the optical fingerprint sensing circuit may be the channel layer 421.

In some embodiment, the drain electrode of the first TFT device may be a portion of a drain electrode layer 412. That is, a portion of the drain electrode layer 412 close to the channel layer 411 may serve as a drain electrode of the first TFT device, and other portions of the drain electrode layer 412 mainly play a role of electrically connecting the drain electrode of the first TFT device with other structures.

In some embodiment, the source electrode of the second TFT device may be a portion of a source electrode layer 422. That is, a portion of the source electrode layer 422 close to the channel layer 421 may serve as the source electrode of the second TFT device, and other portions of the source electrode layer 422 mainly plays a role of electrically connecting the source electrode of the second TFT device with other structures.

In some embodiment, the source electrode of the first TFT device and the drain electrode of the second TFT device are connected by a first electrode layer 4023. Then, a portion of the first electrode layer 4023 close to the channel layer 411 of the first TFT device may serve as the source electrode of the first TFT device, and another portion of the first electrode layer 4023 close to the channel layer 421 of the second TFT device may serve as the drain electrode of the second TFT device. That is, the first electrode layer 4023 may serve as both the source electrode layer of the first TFT device and the drain electrode layer of the second TFT device. In addition, most of a middle portion of the first electrode layer 4023 mainly functions as a conductive connection, and also forms a capacitor with the second electrode layer 4100 which will be described in the following.

In other embodiments, the drain electrode of the first TFT device may be connected with the source electrode of the second TFT device via the first electrode layer.

With continued reference to FIG. 4, the channel layer 411 of the first TFT device may be disposed right under a portion of the bottom electrode layer 431.

In this embodiment, the channel layer 411 of the first TFT device is disposed right under a portion of the bottom electrode layer 431, and the bottom electrode layer 431 is a light blocking layer. Therefore, the bottom electrode layer 431 can be used to block light and to prevent the light from reaching the channel layer 411, and further to avoid occurrence of signal leakage in the photosensitive device. In addition, the bottom electrode layer 431 of the self-luminous device is used to protect the channel layer 210 from light, so that additional structures and additional process steps may not be added, and cost can be saved.

In this embodiment, the channel layer 411 is disposed right under a portion of the bottom electrode layer 431, that is, a portion of the bottom electrode layer 431 blocks an upper side of the channel layer 411 of the first TFT device. In other words, at least a portion of the bottom electrode layer 431 is disposed right above the channel layer 411. Then, an area of a top view of the bottom electrode layer 431 disposed above (including right above and obliquely above) the channel layer 411 may be set to be greater than an area of a top view of the channel layer 411, so as to ensure that a portion of the bottom electrode layer 431 is disposed right above the channel layer 411, and another portion of the bottom electrode layer 431 is disposed obliquely above the channel layer 411. The another portion of the bottom electrode layer 431 disposed obliquely above the channel layer 411 can further protect the channel layer 411 from light so as to better prevent occurrence of the aforementioned signal leakage. Since the bottom electrode layer 431 is mainly disposed on one side of the channel layer 411, an upper left side of the channel layer 411 is blocked by the bottom electrode layer 431, even if an upper right side of the channel layer 411 is blocked by a small portion of the bottom electrode layer 431, the portion of the bottom electrode layer 431 has a smaller area, thereby preventing the bottom electrode layer 431 from blocking the channel layer 421 for light sensing.

With continued reference to FIG. 4, the gate electrode layer 410 of the first TFT device may be disposed under the channel layer 411, and the gate electrode layer 420 of the second TFT device may be disposed under the channel layer 421. The bottom-gate structure may facilitate the channel layer 421 to receive light.

In some embodiment, the optical fingerprint sensing circuit may further include a second electrode layer 4100 disposed on the same layer as the gate electrode layer 410 of the first TFT device and the gate electrode layer 420 of the second TFT device. The second electrode layer 4100 may be disposed under the first electrode layer 4023, and a first insulating layer 401 may be disposed between the second electrode layer 4100 and the first electrode layer 4023.

In some embodiment, the second electrode layer 4100 may be disposed right under the first electrode layer 4023, and the second electrode layer 4100 may be parallel to the first electrode layer 4023. When the second electrode layer 4100 exactly faces to and is parallel to the first electrode layer 4023, and an insulating layer is disposed between the second electrode layer 4100 and the first electrode layer 4023, the second electrode layer 4100 and the first electrode layer 4023 and a portion disposed therebetween can form a capacitor, the capacitor can increase an equivalent capacitance of the photosensitive device, and the larger the equivalent capacitance is, the larger a full well can be reached by the photosensitive device, and the larger an amount of electric charge can be temporarily stored in the photosensitive device, that is, the larger an amount of photo-electronic signals can be temporarily stored in the photosensitive device. Then, the photosensitive device can capture more light information, fingerprint image contrast can be increased correspondingly, and the fingerprint image quality can be improved.

In some embodiment, the second electrode layer 4100 may be connected with a first common electrode (not shown), and the first common electrode may be connected with a first constant potential.

In some embodiment, the top electrode layer 433 may be made of a non-opaque conductive material, and may be connected with a second common electrode (not shown), where the second common electrode may be connected with a second constant potential.

With continued reference to FIG. 4, in some embodiment, the gate electrode layer 410 of the first TFT device and the gate electrode layer 420 of the second TFT device may be disposed directly on the upper surface of the substrate 400. Therefore, the second electrode layer 4100 may be also directly formed on the upper surface of the substrate 400. The gate electrode layer 410, the gate electrode layer 420 and the second electrode layer 4100 may be disposed on a same layer, and thus can be made simultaneously using the same process steps, thereby saving process steps and cost.

In some embodiment, the self-luminous display pixel may include the first insulating layer 401, and the first insulating layer 401 may cover the substrate 400, the gate electrode layer 410, the gate electrode layer 420 and the second electrode layer 4100. A portion of the first insulating layer 401 disposed between the gate electrode layer 410 and the channel layer 411 may serve as a gate dielectric layer of the first TFT device. Another portion of the first insulating layer 401 disposed between the gate electrode layer 420 and the channel layer 421 may serve as a gate dielectric layer of the second TFT device. Another portion of the first insulating layer 401 disposed between the second electrode layer 4100 and the first electrode layer 4023 may serve as an insulating layer of the capacitor formed by the second electrode layer 4100 and the photosensitive device. The drain electrode layer 412, the channel layer 411, the first electrode layer 4023, the channel layer 421 and the source electrode layer 422 may be disposed on the first insulating layer 401.

In some embodiment, the self-luminous display pixel may include a second insulating layer 402. The drain electrode layer 412, the channel layer 411, the first electrode layer 4023, the channel layer 421 and the source electrode layer 422 may be covered by the second insulating layer 402.

In some embodiment, the second insulating layer 402 may be also referred to as a TFT protective layer, that is, the self-luminous display pixel may further include a TFT protective layer. Then, both the first TFT device and the second TFT device may be covered by the TFT protective layer, i.e., the optical fingerprint sensing circuit may be covered by the TFT protective layer to obtain protection from the TFT protective layer.

In some embodiment, the self-luminous display pixel may include a third insulating layer 403 which is disposed on the second insulation layer 402. A portion of the bottom electrode layer 431 may be directly disposed on an upper surface of the third insulating layer 403, while another portion of the bottom electrode layer 431 may penetrate the third insulation layer 403 to be electrically connected with the TFT device circuit of self-luminous circuit. As described above, a region surrounded by a dashed frame D shown in FIG. 4 may indicate an area where the TFT device of the self-luminous circuit is disposed.

In some embodiment, the self-luminous display pixel may further include a fourth insulating layer 404. A portion of the bottom electrode layer 431 disposed on the upper surface of the third insulating layer 403 may be covered by the fourth insulating layer 404. In addition, the fourth insulating layer 404 may surround the self-luminous semiconductor layer 432 and the top electrode layer 433. In addition, an upper surface of the fourth insulating layer 404 may be approximatively flush with an upper surface of the top electrode layer 433. That is, sidewalk of the self-luminous semiconductor layer 432 may be covered by the fourth insulating layer 404. In other embodiments, the upper surface of the fourth insulating layer may be higher than the upper surface of the top electrode layer.

It should be noted that, although not shown in the drawings, in some embodiment, a light blocking wall may be disposed between the self-luminous device and the photosensitive device, and a light-collimating layer may be disposed above the photosensitive device. Specifically, the light-collimating layer may be disposed above the channel layer of the second TFT device.

In the self-luminous display pixel according to the embodiment shown in FIG. 4, the second TFT device may be used as a photosensitive device. Therefore, a structure of the entire self-luminous display pixel can be simplified, process difficulty and cost can be reduced.

More information on the structure and properties of the self-luminous display pixel according to the embodiment shown in FIG. 4 may be referred to corresponding descriptions in the aforementioned embodiments.

Although the present disclosure has been described above, the present disclosure is not limited thereto. It should be understood by those skilled in the art that various changes and modifications may be made without departing from the spirit and scope of the disclosure, and therefore, the scope of the disclosure should be limited by the scope of the claims.

What is claimed is:

1. A self-luminous display pixel, comprising:
   a self-luminous circuit comprising a self-luminous device, the self-luminous device comprising a bottom electrode layer;
   wherein the bottom electrode layer is a light blocking layer; and
   the self-luminous display pixel further comprises an optical fingerprint sensing circuit, the optical fingerprint sensing circuit comprises a first Thin Film Transistor (TFT) device and a photosensitive device, and a channel layer of the first TFT device is disposed right under a portion of the bottom electrode layer,
   wherein the photosensitive device comprises a photosensitive semiconductor layer, the photosensitive semiconductor layer comprises a PIN diode or a PN diode, and the channel layer of the first TFT device is disposed right under a portion of the photosensitive semiconductor layer; a portion of the photosensitive semiconductor layer is disposed right under the bottom electrode layer, another portion of the photosensitive semiconductor layer is not disposed right under the bottom electrode layer, so that an equivalent capacitance of the photosensitive device can be increased; and the self-luminous display pixel comprises a protective layer, the first TFT device and the photosensitive semiconductor layer are covered by the protective layer, and at least a portion of the bottom electrode layer is disposed above an upper surface of the protective layer.

2. The self-luminous display pixel according to claim 1, wherein the photosensitive device further comprises a lower electrode layer, the lower electrode layer is a light blocking layer, and a channel layer of the first TFT device is disposed right under a portion of the lower electrode layer.

3. The self-luminous display pixel according to claim 1, wherein the photosensitive device further comprises a lower electrode layer, and the lower electrode layer is a light blocking layer.

4. The self-luminous display pixel according to claim 1, wherein a gate electrode layer of the first TFT device is disposed under the channel layer; the optical fingerprint sensing circuit further comprises an electrode layer disposed at a same layer with the gate electrode layer; the electrode layer is disposed under the photosensitive device, the electrode layer is at least partially parallel to the photosensitive device, and an insulating layer is disposed between the electrode layer and the photosensitive device; and the electrode layer is connected with a common electrode, and the common electrode is connected with a constant potential.

5. The self-luminous display pixel according to claim 4, wherein the photosensitive device comprises an upper electrode layer connected with a first common electrode, the first common electrode is connected with a first constant potential; and the self-luminous device comprises a top electrode layer connected with a second common electrode, and the second common electrode is connected with a second constant potential.

6. The self-luminous display pixel according to claim 1, wherein a gate electrode layer of the first TFT device is disposed above the channel layer; the optical fingerprint sensing circuit further comprises an electrode layer disposed at a same layer with the gate electrode layer; the electrode layer is disposed under the photosensitive device, the electrode layer is at least partially parallel to the photosensitive device, and an insulating layer is disposed between the electrode layer and the photosensitive device; and the electrode layer is connected with a common electrode, and the common electrode is connected with a constant potential.

7. The self-luminous display pixel according to claim 6, wherein the photosensitive device comprises an upper electrode layer connected with a first common electrode, the first common electrode is connected with a first constant potential; and the self-luminous device comprises a top electrode layer, the top electrode layer is connected with a second common electrode, and the second common electrode is connected with a second constant potential.

8. The self-luminous display pixel according to claim 1, wherein the photosensitive device comprises a second TFT device, and a channel layer of the second TFT device is a region where the optical fingerprint sensing circuit receives light reflected by a finger.

9. The self-luminous display pixel according to claim 8, wherein a source electrode of the first TFT device and a drain electrode of the second TFT device are connected by a first electrode layer, or a drain electrode of the first TFT device and a source electrode of the second TFT device are connected by the first electrode layer; the optical fingerprint sensing circuit further comprises a second electrode layer disposed under the first electrode layer; and the first electrode layer is at least partially parallel to the second electrode layer, and an insulating layer is disposed between the first electrode layer and the second electrode layer; and the second electrode layer is connected with a common electrode, and the common electrode is connected with a constant potential.

10. The self-luminous display pixel according to claim 1, wherein a light blocking wall is disposed between the self-luminous device and the photosensitive device.

11. The self-luminous display pixel according to claim 1, wherein a light collimating layer is disposed above the photosensitive device.

12. The self-luminous display pixel according to claim 1, wherein light emitted from the self-luminous device is used as a light source for the photosensitive device to capture fingerprint.

\* \* \* \* \*